United States Patent
Doppelt

(10) Patent No.: US 7,208,197 B2
(45) Date of Patent: Apr. 24, 2007

(54) METHOD OF DEPOSITING COPPER ON A SUPPORT

(75) Inventor: Pascal Doppelt, Noisy le Sec (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/514,457

(22) PCT Filed: May 15, 2003

(86) PCT No.: PCT/FR03/01483

§ 371 (c)(1),
(2), (4) Date: May 24, 2005

(87) PCT Pub. No.: WO03/097651

PCT Pub. Date: Nov. 27, 2003

(65) Prior Publication Data

US 2005/0214460 A1  Sep. 29, 2005

(30) Foreign Application Priority Data

May 22, 2002 (FR) .................................... 0206228

(51) Int. Cl.
*C23C 16/06* (2006.01)
(52) U.S. Cl. ............... 427/250; 427/255.394; 427/255.7
(58) Field of Classification Search ................ 427/250, 427/248.1, 255.394, 255.7
See application file for complete search history.

(56) References Cited

U.S. PATENT DOCUMENTS

| | | | |
|---|---|---|---|
| 3,664,933 A * | 5/1972 | Clauss ........................ 205/184 |
| 4,751,106 A * | 6/1988 | Wilkinson et al. ......... 427/97.2 |
| 5,096,737 A * | 3/1992 | Baum et al. ................. 427/573 |
| 5,578,553 A * | 11/1996 | Koriyama et al. ........... 505/125 |
| 5,773,639 A * | 6/1998 | Kawaguchi et al. ........ 556/113 |
| 5,939,150 A * | 8/1999 | Stelzle et al. ............... 427/558 |
| 6,130,345 A * | 10/2000 | Doppelt ....................... 556/12 |
| 6,184,403 B1 * | 2/2001 | Welch et al. .................. 556/12 |
| 6,291,025 B1 * | 9/2001 | Tepper et al. .............. 427/96.6 |
| 6,372,928 B1 * | 4/2002 | Kawaguchi et al. .......... 556/10 |
| 6,824,665 B2 * | 11/2004 | Shelnut et al. .............. 205/102 |

FOREIGN PATENT DOCUMENTS

GB  1 251 183  10/1971

OTHER PUBLICATIONS

Chi et al., "Chemistry of copper (I).beta.-diketonate complexes. VI. Synthesis, characterization and chemical vapor deposition of 2,2-dimethyl-6,6,7,7,8,8,8-heptafluoro-3,5-octanedione (fod) copper (I) (fod)CuL complexes and the solid state structure of (fod)Cu(PMe$_3$)," Journal of Organometallic Chemistry, Elsevier-Sequoia S.A. Lausanne, CH, vol. 449, pp. 181-189 XP002229352, 1993.

Hakansson et al., "Copper(I) complexes with conjugated dienes," Journal of Organometallic Chemistry, Elsevier-Sequoia S.A. Lausanne, CH., vol. 602, No. 1-2, pp. 5-14, XP004200823, May 2000.

Search Report issued in International Application No. PCT/FR03/01483.

* cited by examiner

*Primary Examiner*—Bret Chen
(74) *Attorney, Agent, or Firm*—Buchanan Ingersoll & Rooney PC

(57) ABSTRACT

A process for the deposition of copper on a support. The process includes bringing a copper precursor, in the vapor phase, into contact with a heated support, optionally in the presence of hydrogen. The copper precursor is in the form of a CuCl or CuBr composition in a nonaromatic, nonplanar and heteroatom-free liquid organic solvent which exhibits at least two nonconjugated unsaturations.

10 Claims, No Drawings

METHOD OF DEPOSITING COPPER ON A SUPPORT

BACKGROUND OF THE INVENTION

1. Field of the Invention

The invention relates to a process for the deposition of copper on a support, in particular for integrated circuits.

2. Description of the Related Art

The use of copper for producing electrical contacts in integrated circuits is justified by its low electrical resistivity and its low electromigration.

It is known to deposit thin layers on supports by a PVD (physical vapor deposition) process or by a CVD (chemical vapor deposition) process. CVD gives more even deposits as the first stage is an absorption stage which is not directional.

Various processes for the deposition of copper layers employing CuCl precursors have been provided in the prior art:

J. C. A. Boyens et al. (S. Afr. J. Chem., 1986, 39(4), 229) disclose a ((COD)CuCl)$_2$ complex prepared by diffusion of SO$_2$ into a solution of CuCl$_2$.2H$_2$O and 1,5-cyclooctadiene (COD) in ethanol. The complex is characterized by an X-ray crystal structure obtained from a monocrystal and it is used in photoreactions.

N. Bourhila et al. [Appl. Surf. Sci., 91 (1–4), 175–181 (1995)] disclose the use of (CuCl)$_3$ for the deposition of Cu films by CVD in a low-pressure reactor. The process is an in situ chloridation of Cu by Cl$_2$ which results in the deposition of copper by the reduction of Cu$_3$Cl$_3$ by hydrogen in the reactor. The purpose of the studies was to find a Cu precursor capable of replacing Cu precursors in the solid form, which present a problem in controlling the vapor pressure during the deposition. The solution provided consists in synthesizing the precursor immediately above the surface on which Cu has to be deposited. The disadvantage of this process is that it deposits a Cu film both on the support to be covered and on the walls of the reactor, which it is subsequently necessary "to clean".

Other processes employing precursors of the diketonate type have also been provided:

P. Doppelt and T. H. Baum (MRS Bull., XIX (8), (1994) 41) provide a process for the deposition of copper films by CVD on supports for the preparation of electrical contacts in integrated circuits, for the preparation of electronic components with metal lines of less than 0.25 μm. The copper precursors mentioned are in particular complexes in which Cu is coordinated by an acetylacetonate (acac) group, a trifluoroacetylacetonate (tfac) group or a hexafluoroacetylacetonate (hfac) group and stabilized by various ligands, in particular COD or DMCOD (1,5-dimethyl-1,5-cyclooctadiene) ligands.

FR-2 760 743 (or U.S. Pat. No. 6,130,345) discloses various copper precursors for the deposition of copper by CVD, in particular CU(I) coordination complexes stabilized by a ligand, in which Cu is coordinated by a β-diketonate, in particular by a hexafluoroacetylacetonate, and stabilized by various ligands.

Chen et al. [Chem. Mat., 13, 3993 (2001)] disclose copper precursors, of the diketonate type, stabilized by 2-methyl-1-hexen-3-yne. They are in particular Cu(acac)MHY, Cu(tfac)MHY, Cu(hfac)MHY and Cu(pfac)MHY. MHY is 2-methylhex-3-yne. The process employs a low-pressure CVD reactor into which a mixture of Cu(hfac)MHY precursor (which is a liquid) and of pure MHY (95/5) is injected in the liquid form. In view of the respective proportions of the constituents, this is not a solution of the complex in MHY. MHY acts simply to reduce the viscosity of the liquid complex.

U.S. Pat. No. 5,096,737 discloses the use of Cu(I) complexes as precursors for the deposition of copper by CVD. The complexes are formed by Cu(I) coordinated to a β-diketonate and are stabilized by a ligand. The β-diketonate can be, for example, acac, tfac or hfac. The ligand can be an alkyne, an olefin, a diene or a phosphine, for example COD or DMCOD. The DMCOD(Cu(I))(hfac) precursor is introduced into the CVD reactor by bubbling argon through the liquid precursor.

U.S. Pat. No. 5,098,516 discloses a process for the deposition of a copper film on a support by bringing said support into contact, at a temperature between 110° C. and 190° C., with an organometallic copper complex coordinated by a β-diketonate (in particular hfac) stabilized by a ligand. The precursor is chosen for its volatile nature and can thus be introduced into the reactor in the gaseous form.

U.S. Pat. No. 5,085,731 and U.S. Pat. No. 5,144,049 disclose copper complexes which can be used for the deposition of copper films by CVD. The complexes are volatile liquid organo-metallic complexes coordinated by a fluorinated acetyl-acetonate and stabilized by a ligand. For the implementation of the CVD, the precursor is introduced into the reactor in the form of a pure precursor vapor or is entrained by argon towards the reactor by bubbling argon through the liquid precursor.

However, the use of these complexes of copper which is coordinated by a β-diketonate for the deposition of a copper film exhibits a major disadvantage: the heteroatoms present in the ligands are reencountered in the form of contaminants in the deposited copper film.

In addition, provision has been made for the deposition of copper films by a CVD process using a precursor solution. For example, WO 98/00432 discloses a process for the deposition of a metal layer by CVD starting from a solution of a platinum complex using a liquid injector. Such a process is advantageous technically but it can be employed only with precursor complexes which are readily soluble in the solvents which can be used in liquid injectors.

SUMMARY OF THE INVENTION

The purpose of the present invention is to provide a Cu complex in which the coordinating group does not comprise a heteroatom which interferes with the deposition of the metal and which is soluble in a solvent which can be used in CVD.

For this reason, a subject matter of the present invention is a composition of a copper precursor and a process for the deposition of a copper film on a support using said composition.

The copper precursor composition according to the invention is a composition of a copper salt in a liquid organic solvent and it is characterized in that:

the copper salt is chosen from copper(I) chloride and copper(I) bromide;

the liquid organic solvent is a nonaromatic, nonplanar and heteroatom-free compound which exhibits at least two nonconjugated unsaturations and which is chosen from:

a) noncyclic compounds optionally carrying at least one alkyl group on at least one of the carbon atoms of an unsaturated group;

b) cyclic compounds comprising two unsaturations on the ring, said ring carrying at least one alkyl substituent;

c) cyclic compounds in which one unsaturation forms part of the ring and one unsaturation is placed on a substituent of the ring;

d) cyclic compounds in which two unsaturations are placed on the same substituent of the ring or two different substituents.

DETAILED DESCRIPTION OF THE PREFERRED EMBODIMENTS

The compositions according to the invention are obtained by introducing the precursor into the solvent and by allowing the mixture to stand for a certain time. The period of time depends on the temperature at which the medium is maintained. By way of example, a period of time of 2 hours is sufficient when the temperature is maintained at 90° C.

The CuCl or CuBr compositions thus obtained can advantageously be used for the decomposition of copper films on a support. They have a concentration of copper salt preferably of greater than $10^{-3}$ mol/l. The upper limit value is determined by the saturation concentration, which depends essentially on the liquid organic solvent and on the temperature.

The process for the deposition of a copper film according to the invention consists in bringing a copper precursor, in the vapor phase, into contact with a heated support, optionally in the presence of hydrogen, and it is characterized in that the copper precursor is CuCl or CuBr used in the form of a composition in a nonaromatic, nonplanar and heteroatom-free liquid organic solvent which exhibits at least two nonconjugated unsaturations, as defined above.

The complex formed between the copper salt and the solvent is not very stable and it reversibly decomposes to CuCl or to CuBr and to solvent when the composition is vaporized.

Preference is given, among the solvents defined above, in particular to 1,5-dimethyl-1,5-cyclooctadiene (DMCOD), 4-vinyl-l-cyclohexene, 2-methylhex-3-yne (MHY), 5-ethylidene-2-norbornene and 1,2,4-trivinylcyclohexane.

During the implementation of the process for the deposition of copper layers on a support, the composition comprising the copper precursor is conveyed into a vaporization device via which it is introduced into a reactor at high temperature which comprises the support on which the copper layer has to be deposited. Before its arrival in the vaporization device, the composition is generally kept in a reservoir at ambient temperature. The vaporization of the precursor composition can be carried out using various devices known to a person skilled in the art. Mention may be made, as preferred example, of the device described in Chem. Mat., 13, 3993 (2001). Said device, sold by Jipelec under the name of "TriJet Liquid Precursor Delivery and Evaporation System", comprises three main parts: the reservoir, an injector and an evaporator. The solution of copper (I) chloride or bromide, which is situated in the tank maintained at a pressure of 1 bar, is propelled by virtue of the injector by a pressure difference into the evaporator, which is maintained under vacuum. The injection flow rate is controlled by an electrically operated microvalve directed by a computer. The evaporator and the remainder of the assembly, which consists mainly of a reaction chamber for a single support, are maintained at the same temperature.

A cold plasma can optionally be added around the support. When the deposition is carried out in the presence of plasma, it is sufficient for the support intended to receive the copper layer to be maintained at the same temperature as prevails in the reactor. In the absence of plasma, it is necessary for said support to be at a temperature greater than that of the reactor, the difference in temperature being at least equal to 20° C., preferably at least equal to 50° C., in order to prevent deposition of copper on the reactor walls.

The support can be composed of a material chosen in particular from Si, AsGa, InP, SiC and SiGe. The copper layer can be deposited on said support as first metallization layer or as nth metallization layer for electronic devices requiring several levels of metallization. The support can be composed of one of the abovementioned materials taken as such or else of one of these materials carrying one or more intermediate layers. Mention may be made, as examples of intermediate layers, of diffusion layers composed of a material chosen, for example, from TiN, TiSiN, Ta, TaN, TaSiN, WN and WSiN.

The thickness of copper which is deposited on the support depends on the concentration of the precursor composition, on the flow rate of this composition during passage into the vaporization device, on the duration of the vaporization and on the respective temperatures in the reactor and on the support. Generally, compositions which are less concentrated and/or flow rates which are lower are used to obtain fine layers and compositions which are more concentrated and/or flow rates which are higher are used to obtain thick layers. The term "fine layer" is generally understood to mean a layer having a thickness of less than or equal to 50 nm, referred to as a "nucleation layer". The term "thick layer" is generally understood to mean a layer having a thickness of between 50 nm and 1 µm.

To obtain thick layers, use may be made of the compositions in a solvent with a high dissolution coefficient at a precursor concentration close to saturation. The concentration has to remain below the saturation value in order to prevent reprecipitation of the precursor, which would have the effect of interfering with the vaporization.

To obtain thin layers, use may be made of the solvents in which the solubility of the precursor is lower. Use may also be made of an organic liquid which is a nonsolvent of the precursor and which is chemically inert with respect to the precursor in order to dilute a precursor composition according to the invention. For example, toluene can be used to dilute a precursor composition in DMCOD.

The use of the compositions according to the invention for the preparation of copper layers by CVD makes it possible to obtain copper layers of good quality having good adhesion to the support on which they are deposited.

The invention is described in more detail using the following examples, which are given by way of illustration but to which the invention is not limited.

EXAMPLE 1

Preparation of CuCl Compositions

CuCl compositions were prepared in various solvents. For each preparation, CuCl was introduced under an inert nitrogen atmosphere into a round-bottomed flask equipped with a reflux condenser. 10 ml of solvent, degassed beforehand, were subsequently introduced. The composition was subsequently heated at 90° C. for 2 hours.

The amount of complex formed was determined by filtering the composition obtained, by pouring it into 250 ml of pentane and by weighing the precipitate obtained after filtration and drying. The solid which remained in the round-bottomed flask was also dried and weighed in order to confirm the mass balance. The results obtained are given in table I.

TABLE I

| CuCl weight (g) | Solvent | Weight of the precipitate (mg) | Solubility (mg/ml) | Solubility (mol/l) |
|---|---|---|---|---|
| 1.005 | DMCOD (dimethyl-cyclooctadiene) | 411 | 41.1 | 0.42 |
| 1.008 | 1,2,4-trivinylcyclohexane | 731.1 | 73.1 | 0.74 |
| 1.007 | 4-vinylcyclo-1-hexene | 189.1 | 18.91 | 0.19 |
| 1.002 | 2-methylhex-3-yne (MHY) | 594.4 | 59.4 | 0.60 |
| 1.015 | 5-ethylidene-2-norbornene | 653 | 65.3 | 0.66 |

EXAMPLE 2

Preparation of CuBr Compositions

A CuBr composition in DMCOD was prepared under conditions analogous to those of example 1. The results are given in table II.

TABLE II

| CuBr weight (g) | Solvent | Weight of the precipitate (mg) | Solubility (mg/ml) | Solubility (mol/l) |
|---|---|---|---|---|
| 1.005 | DMCOD (dimethyl-cyclooctadiene) | 170 | 17 | 0.12 |

EXAMPLE 3

A copper film was deposited, using a CuCl composition in DMCOD obtained according to the process of example 1, on a support maintained at 350° C. and placed in a reactor at 250° C. under a pressure of 5 Torr. The CuCl composition is conveyed into a vaporization device at the same time as gaseous hydrogen. The flow rate of the gaseous hydrogen was 150 ml/min.

In a first test, the support was a silicon wafer which has a diameter of 4 inches and which is covered with a TiN film having a thickness of 200 nm, and the flow rate of precursor composition was 0.7 ml/min. In a second test, the support was a silicon wafer which has a diameter of 8 inches and which is covered with a TiN film having a thickness of 200 nm, and the flow rate of precursor composition was 2.7 ml/min.

In each case, an adherent copper film of good quality with a growth rate of 20 nm/min was obtained.

What is claimed is:

1. A process for the deposition of a copper film on a support, comprising bringing a copper precursor, in the vapor phase, into contact with a heated support, optionally in the presence of hydrogen, wherein the copper precursor is in the form of a composition of a copper salt in a liquid organic solvent, in which:
   - the copper salt is chosen from copper(I) chloride and copper(I) bromide,
   - the liquid organic solvent is a nonaromatic, nonplanar and heteroatom-free compound which exhibits at least two nonconjugated unsaturations and which is chosen from:
     a) noncyclic compounds optionally carrying at least one alkyl group on at least one of the carbon atoms of an unsaturated group;
     b) cyclic compounds comprising two unsaturations on the ring, said ring carrying at least one alkyl substituent;
     c) cyclic compounds in which one unsaturation forms part of the ring and one unsaturation is placed on a substituent of the ring;
     d) cyclic compounds in which two unsaturations are placed on the same substituent of the ring or two different substituents.

2. The process as claimed in claim 1, wherein the liquid organic solvent is chosen from 1,5-dimethyl-1,5-cyclooctadiene (DMCOD), 4-vinyl-1-cyclohexene, 2-methyl-hex-3-yne (MHY), 5-ethylidene-2-norbornene and 1,2,4-trivinylcyclohexane.

3. The process as claimed in claim 1, wherein the precursor composition additionally comprises an organic liquid which is a nonsolvent of the precursor and which is chemically inert with respect to the precursor.

4. The process as claimed in claim 1, wherein the concentration of precursor is greater than $10^{-3}$ mol/l.

5. The process as claimed in claim 1, wherein the copper precursor composition is conveyed into a vaporization device via which it is introduced into a reactor at a temperature lower than that of the support on which the copper layer is deposited.

6. The process as claimed in claim 5, wherein the difference in temperature between the reactor and the support is at least 20° C.

7. The process as claimed in claim 1, wherein a cold plasma is added around the support, the temperature of the support being at least equal to the temperature of the reactor.

8. The process as claimed in claim 1, wherein the support is composed of a material chosen from Si, AsGa, InP, SiC and SiGe.

9. The process as claimed in claim 8, wherein the support carries an intermediate layer.

10. The process as claimed in claim 9, wherein the intermediate layer is composed of a material chosen from TiN, TiSiN, Ta, TaN, TaSiN, WN and WSiN.

* * * * *